United States Patent [19]

Mimura et al.

[11] 4,173,674

[45] Nov. 6, 1979

[54] DIELECTRIC INSULATOR SEPARATED SUBSTRATE FOR SEMICONDUCTOR INTEGRATED CIRCUITS

[75] Inventors: Akio Mimura; Takaya Suzuki; Seturo Yagiyu, all of Hitachi, Japan

[73] Assignee: Hitachi, Ltd., Japan

[21] Appl. No.: 888,981

[22] Filed: Mar. 22, 1978

Related U.S. Application Data

[63] Continuation-in-part of Ser. No. 680,882, Apr. 27, 1976, abandoned.

[30] Foreign Application Priority Data

May 12, 1975 [JP] Japan .................................. 50-54585

[51] Int. Cl.² ......................... B32B 7/00; B32B 9/04; H01L 21/304; H01L 21/316
[52] U.S. Cl. ................................ 428/220; 29/576 W; 148/187; 357/59; 428/336; 428/446; 428/538; 428/539
[58] Field of Search ............... 428/538, 446, 220, 336, 428/337, 539; 29/580, 576 W; 156/3, 8, 17, 631, 632, 636, 649, 657, 662; 148/187; 357/59

[56] References Cited

U.S. PATENT DOCUMENTS

| | | | |
|---|---|---|---|
| 3,486,892 | 12/1969 | Rosvold | 156/662 |
| 3,624,463 | 11/1971 | Davidsohn | 357/59 |
| 3,680,205 | 8/1972 | Kravitz | 156/17 |
| 3,749,619 | 7/1973 | Muraoka | 156/17 |
| 3,817,799 | 6/1974 | Schutze | 156/649 |
| 3,826,699 | 7/1974 | Sawazaki | 29/580 |
| 3,884,733 | 5/1975 | Bean | 29/580 |
| 4,017,341 | 4/1977 | Suzuki et al. | 357/59 |
| 4,079,506 | 3/1978 | Suzuki et al. | 357/59 |

*Primary Examiner*—Ellis P. Robinson
*Attorney, Agent, or Firm*—Craig and Antonelli

[57] ABSTRACT

A dielectric insulator separated substrate comprises a plurality of monocrystalline semiconductor island regions in which circuit elements are to be formed and a support region for supporting the island regions while a dielectric film formed on the supporting region electrically separates the island regions from each other. The supporting region comprises crystalline semiconductor layers and at least one oxygen diffusion preventive film laminated alternately.

The extreme outer polycrystalline semiconductor layer of the supporting region is polished to such a thickness as to prevent the substrate from being curved greatly by the wedge action due to the oxygen diffusion. Since the extreme outer polycrystalline semiconductor layer thus polished has a flat surface, the handling of the substrate is easy. The substrate devoid of any curveness deformation assures a highly accurate formation of the circuit elements in the island regions.

3 Claims, 17 Drawing Figures

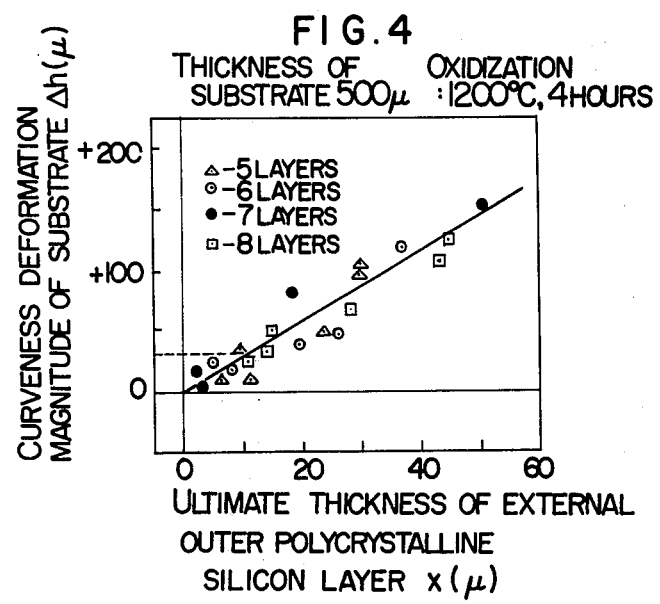
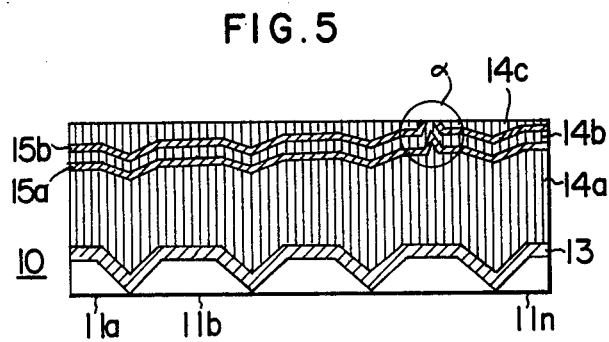

DIELECTRIC INSULATOR SEPARATED SUBSTRATE FOR SEMICONDUCTOR INTEGRATED CIRCUITS

CROSS REFERENCES TO RELATED APPLICATION

This application is a continuation-in-part application for our copending application, Ser. No. 680,882 filed on Apr. 27, 1976, now abandoned.

BACKGROUND OF THE INVENTION

This invention relates to a dielectric insulator separated substrate for semiconductor integrated circuits, which includes a large number of monocrystalline semiconductor island regions in which circuit elements are to be formed and a polycrystalline semiconductor support region for supporting fixedly the island regions.

In a semiconductor integrated circuit, circuit elements such as resistors, diodes, transistors, thyristors and the like may be formed integrally in island regions while being required to be electrically separated from each other. For this, a large number of island regions are electrically insulated from each other and from a support region which supports them. One of the insulating methods uses dielectric materials and a substrate prepared according to this method is called a dielectric insulator separated substrate (hereinafter referred simply to as DI substrate).

The DI substrate, however, undergoes curveness deformations during its preparation process and upon the production of semiconductor integrated circuits. The deformation brings about various defects including cracks in the substrate, degraded accuracy of metal deposition for the electrodes, degradation of the withstand voltage and fluctuations in characteristics of the circuit elements.

The U.S. patent applications Ser. Nos. 604,947 now U.S. Pat. No. 4,017,341 and 637,959 now U.S. Pat. No. 4,079,506 assigned to the same assignee of the present application describe in detail causes for the curveness deformations of the DI substrate and propose a countermeasure therefor. More particularly, there are two types of curveness deformations of the DI substrate. In one type, the DI substrate is deformed convexly toward the side of the monocrystalline semiconductor island regions. In the other type, the DI substrate is deformed convexly toward the side of the polycrystalline semiconductor support region. The curveness deformation of the former type is caused by the difference in thermal expansion coefficient between the monocrystalline island regions and the polycrystalline support region. In the latter type, the deformation results from the wedge action due to oxygen diffused into the polycrystalline support region.

Accordingly, the prior patent applications set forth above proposed to provide a film for preventing the diffusion of oxygen into the surface of the polycrystalline layer of the support region and/or a film for compensating for the difference in thermal expansion coefficient between the island regions and the support region.

According to inventions disclosed in the prior patent applications set forth above, it was confirmed that the DI substrate per se is removed of the curveness deformations but some disadvantages still remain in the production of semiconductor integrated circuits.

Herein, these disadvantages will be explained with reference to the drawing illustrating the production process according to the above prior patent applications.

As illustrated in FIG. 1a, after thermal oxidation of one principal surface of an N-type monocrystalline silicon wafer 1, a mesh (grid) pattern of separation channels 2 is formed on the surface by photoetching. Thereafter, a dielectric insulative silicon oxide film 3 is again formed by heating over the principal surface of the water. Next, as shown in FIG. 1b, a thick polycrystalline silicon layer 4a is formed in a vapor growth reaction furnace, and then a silicon oxide film 5a, a thin polycrystalline silicon layer 4b, a silicon oxide film 5b for preventing the oxygen diffusion and a polycrystalline silicon layer 4c are grown one over another in this order to form a lamination.

The alternate lamination of the polycrystalline silicon layers 4a to 4c and the silicon oxide films 5a and 5b can easily be prepared by introducing at desired number of times water vapor or carbon dioxide into the reaction furnace during the thermal decomposition growth of trichloride silane or quadrachloride silane to thereby react thermally decomposed silicon with oxygen.

By regulating the number of the alternate lamination of the polycrystalline silicon layers 4a to 4c and the silicon oxide films 5a and 5b, the thickness of individual layers and films and the vapor growth temperature, the curveness deformation of the monocrystalline silicon wafer 1 due to the difference in thermal expansion coefficient between the layers and films can be reduced to zero.

By using the flat bottom principal surface of the monocrystalline silicon wafer 1 as datum plane, the polycrystalline silicon layer 4c is polished flatly to a level A designated as a chained line, as shown in FIG. 1b. Next, by utilizing the flattened surface of the polycrystalline silicon layer 4c, the single crystalline silicon wafer 1 is polished flatly to a level B designated as a chained line to thereby obtain a number of monocrystalline silicon island regions 1a, 1b, . . . , 1n insulatedly separated from each other by means of the previously formed silicon oxide film 3.

When forming circuit elements in the plurality of single crystalline silicon island regions 1a, 1b, . . . , 1n by diffusion technique, the extreme outer polycrystalline silicon layer 4c yields the wedge action owing to the heat treatment of the substrate in oxidization atmosphere with the result that the DI substrate as shown in FIG. 1c would undergo the curveness deformation. For this reason, the extreme outer polycrystalline silicon layer 4c was removed by etching and the surface of the silicon oxide film 5b was exposed as shown in FIG. 1d.

As illustrated in these figures, traces corresponding to the separation channels remain on the outer film 5b and the surface of the silicon oxide film 5b becomes considerably irregular.

In addition to the traces corresponding to the separation channels 2, the irregularity results from projections due to local abnormal growth of the polycrystalline silicon.

When diffusing impurities into the individual monocrystalline silicon island regions 1a, 1b, . . . , 1n, the silicon oxide film 5b side of the substrate is attracted by a vacuum chuck and fixed thereto and then a mask is applied to the opposite side of the substrate. Thereafter, a photoresist is applied upon the surfaces of the monocrystalline silicon island regions 1a, 1b, . . . , 1n through the mask. In this process, however, the irregularities present on the surface of the silicon oxide film 5b prevents steady support for the substrate by the vacuum chuck thereby to degrade the masking accuracy.

If the mask was pressed on the surfaces of the monocrsytalline silicon island regions 1a, 1b, . . . , 1n in order to ensure an intimate contact of the mask with the DI substrate, the DI substrate was sometimes broken down owing to the projections which act as fulcrums.

SUMMARY OF THE INVENTION

An object of the invention is to provide a DI substrate having insulated island regions in which integrated circuit elements are to be formed.

Another object of the present invention is to provide a DI substrate which is prevented from its breakage during preparation of integrated circuits.

A further object of this invention is to provide a DI substrate wherein the DI substrate is free from curveness deformations and precisely and finely dimensioned circuit elements can be formed in the DI substrate at high yield rate.

A further object of this invention is to provide a DI substrate applicable to the preparation of various types of DI substrate.

According to this invention, there is provided a dielectric insulator separated substrate which comprises a plurality of monocrystalline semiconductor island regions in which circuit elements are to be formed and a support region which comprises polycrystalline semiconductor layers and at least one oxygen diffusion preventive film. These layers and the film are laminated alternately to form the support region having its extreme outer layer of the polycrystalline semiconductor layer. The extreme outer polycrystalline semiconductor layer has a highly flat surface and predetermined thickness as to prevent the substrate from being curved greatly by the wedge action due to the oxygen diffusion.

BRIEF DESCRIPTION OF THE DRAWINGS

FIGS. 3 and 4 are graphic representations showing the relation between the ultimate thickness of the extreme outer polycrystalline silicon layer after polished and the magnitude of curveness deformation of the DI substrate when the entire thickness of the DI substrate and the number of the alternately laminated polycrystalline silicon layers and silicon oxide films are changed.

FIG. 5 is a longitudinal section view of one example of DI substrate prepared according to this invention.

DESCRIPTION OF THE PREFERRED EMBODIMENT

Hereunder, the preparing method of this invention will be described by way of examples.

Figure 1A:
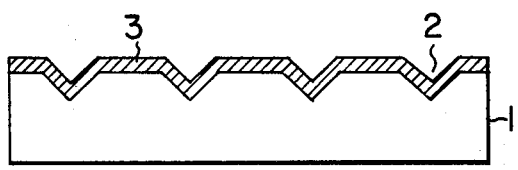
FIGS. 1a to 1d are longitudinal section views showing preparation steps based on single-poly method of a DI substrate disclosed in the prior United States patent applications.
Figure 1B:
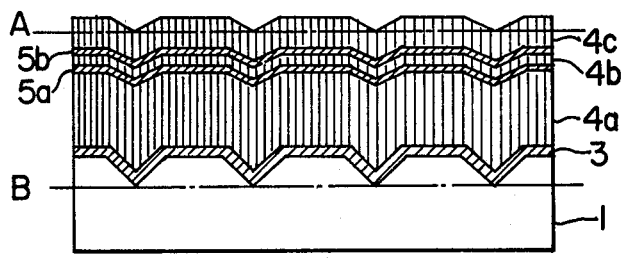
Figure 1C:
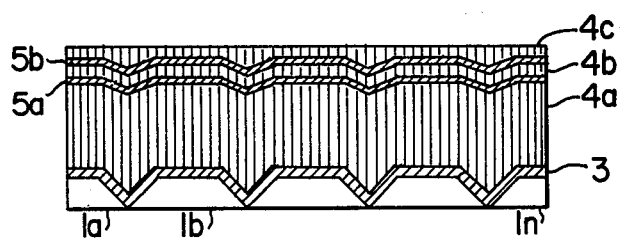
Figure 1D:
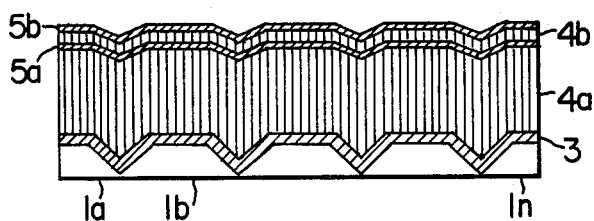
Figure 2A:
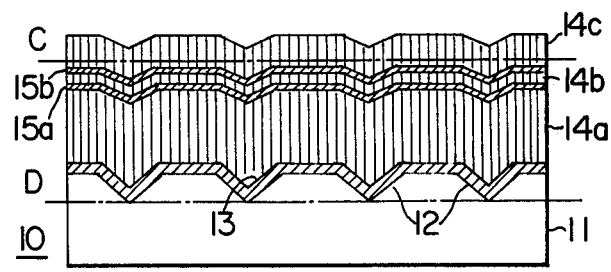
FIGS. 2a and 2b are longitudinal section views showing preparation steps based on single-poly method of a DI substrate according to this invention.

FIG. 2a shows the same DI substrate as that shown in FIG. 1b. This substrate is prepared by the method employed in steps of FIGS. 1a and 1b.

Polycrystalline silicon layers 14a, 14b and 14c and silicon oxide films 15a and 15b representative of oxygen diffusion preventive films are alternately laminated on the monocrystalline silicon wafer 11 provided with separation channels 12 through a silicon oxide film 13.

More particularly, these films 15a, 15b in the lamination prevent the monocrystalline silicon wafer 11 from undergoing the curveness deformations by compensating for the difference in thermal expansion coefficient between the monocrystalline silicon wafer 11 and the polycrystalline silicon layers 14a to 14c.

It is an essential feature of the present invention that the extreme outer layer 14c is a polycrystalline silicon layer.

The number of the silicon oxide films to be laminated is determined dependent upon the structure of a DI substrate 10 and by no means limited to two as illustrated by the silicon films 15a and 15b. Further, their insertion position is not limited to that shown in the figure.

Figure 2B:
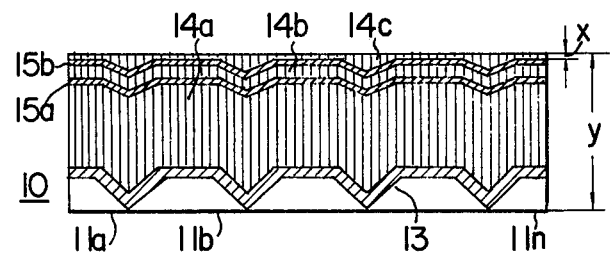

Next, by using as datum plane the flat bottom principal surface of the monocrystalline silicon wafer 11, the extreme outer polycrystalline silicon layer 14c is polished to a level C designated at a chained line as shown in FIG. 2a. Through this polishing process, the traces corresponding to the separation channels 12 are removed. Thereafter, by using as datum plane the flattened top principal surface of the extreme outer polycrystalline silicon layer 14c, the monocrystalline silicon wafer 11 is polished to a level D designated at a chained line, thereby obtaining a plurality of monocrystalline silicon island regions 11a to 11n insulatedly separated by the silicon oxide film 13. This phase is shown in FIG. 2b.

Conventionally, the extreme outer polycrystalline silicon layer was removed by etching in the next phase. In accordance with this invention, however, the extreme outer layer is not removed completely and oxidization and diffusion are carried out in the next step.

In a preparatory process for the diffusion step, a silicon oxide film that acts as diffusion mask is formed by thermal oxidization process. During the preparatory process, oxygen would diffuse into the extreme outer polycrystalline silicon layer 14c. In this invention, the extreme outer polycrystalline silicon layer 14c is polished to be of a small thickness and the oxygen diffusion is prevented by the silicon oxide film 15b. Namely, the layer responsible for inducing the curveness deformation due to the wedge action of oxygen diffusion is thin and the DI substrate 10 is almost freed from the curveness deformations.

Then, a diffusion mask corresponding to a diffusion pattern is applied on the monocrystalline silicon island regions 11a to 11n. The photoetching is applied to the silicon oxide film. Since the DI substrate is freed from the curveness deformations, and moreover since the top principal surface of the extreme outer polycrystalline silicon layer 14c is flattened by polishing, the substrate may be supported steadily by the vacuum chuck. Even if a compressive force is applied to the substrate during this process, the DI substrate 10 cannot be cracked, because it has a polished flat surface on the extreme outer polycrystalline layer 14c.

Thereafter, the DI substrate is placed in a diffusion furnace and impurities are diffused into the monocrystalline silicon island regions 11a to 11n. In this process, too, oxygen atmosphere inside the diffusion furnace will cause the oxygen diffusion into the extreme outer polycrystalline silicon layer 14c but the DI substrate 10 is almost freed from the curveness deformation for the same reason as that for the oxidization step.

In this manner, even if similar diffusion treatments are repeated, the effect of this invention may be alive and the curveness deformation of the DI substrate may be prevented without fail.

Where an upper limit of the magnitude range of the curveness deformation of the DI substrate due to the oxidization and diffusion processes, which is no trouble for effecting the subsequent photoetching, electrode formation and the like handling, is set to 30 microns, the ultimate thickness x of the extreme outer polycrystalline silicon layer 14c after polished shown in FIG. 2b must satisfy $x \leq y/40$ when the entire thickness y of the DI substrate 10 also shown in FIG. 2b is 200 microns to 500 microns.

The lower limit of the entire thickness y of the DI substrate 10, which depends on the handling conditions and the degree of heat treatment, can be reduced to about 200 microns if the condition for heat treatment is not severe, i.e., if the temperature for oxidization is lower and the time thereof is shorter relatively. Although it is preferable to make thicker the entire thickness y in view of the mechanical strength and reduction of curveness deformation, an upper limit of the entire thickness is about 500 microns in view of the reduction of cost price. The relation between the ultimate thickness x and the curveness deformation magnitude $\Delta h$ after the diffusion step is completed was measured in accordance with the entire thickness y of the DI substrate 10 of 500 microns, 450 microns, 300 microns and 200 microns to obtain corresponding curves a to d shown in FIG. 3.

Figure 3:
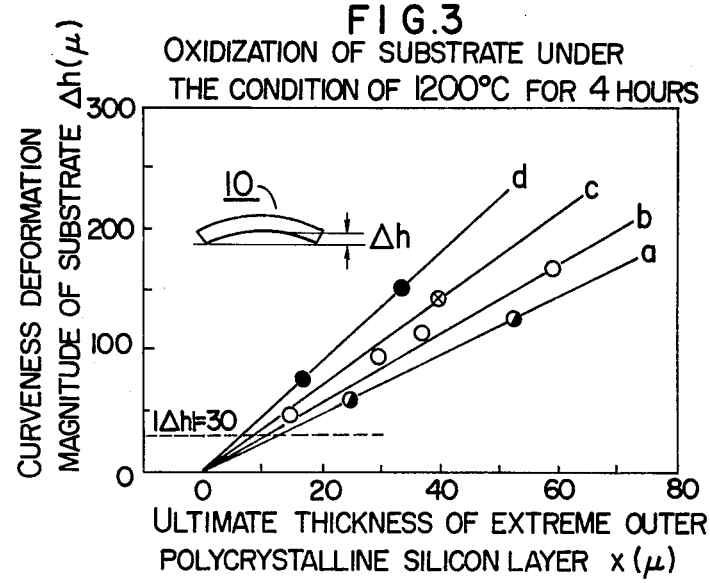

It will be understood from FIG. 3 that, for a fixed value of the ultimate thickness x, the thicker the entire thickness y of the DI substrate 10 is, the smaller the magnitude of the curveness deformation becomes.

From FIG. 3, the following relationships will be found. FIG. 3 shows a heat treatment conditions for thermal oxidization. When an upper limit of curveness deformation $\Delta h$ is set to 30 microns, the ultimate thicknesses x of the polycrystalline layer are less than 14 microns, less than 11 microns, less than 8 microns and less than 6 microns for the entire thicknesses y of 500 microns, 450 microns, 300 microns and 200 microns, respectively. In other words, these relationship may be represented by the relation $x \leq y/40$.

A measurement was conducted to study how the ultimate thickness of the extreme outer polycrystalline silicon layer 14c affects the curveness deformation magnitude of the substrate when the number of the polycrystalline silicon layers 14 and silicon oxide films 15 is changed. The results are shown in FIG. 4.

Substrates were prepared under the condition that growth temperature for both the polycrystalline silicon layers 14 and the silicon oxide films 15 is 1200° C., each one of the silicon oxide films 15 has a thickness of 1.4 microns and the entire thickness y of the DI substrate 10 is 500 microns for each case.

It will be seen from FIG. 4 that the curveness deformation magnitude of the substrate is determined by the ultimate thickness x of the extreme outer polycrystalline silicon layer 14c and hardly affected by the number of the alternately laminated layers and films.

Further, an experiment was conducted to study how the curveness deformation magnitude of the substrate is affected by changing within the range from 0.3 microns to 1.4 microns the thickness of the silicon oxide films 15a and 15b. It was confirmed that the thickness of the silicon oxide films 15a and 15b is no relation to the curveness deformation magnitude. That is to say, this shows that even thin silicon oxide films sufficiently prevent the oxygen diffusion into the adjacent polycrystalline silicon layer 14b.

It will be appreciated from the foregoing description that when the ultimate thickness x of the extreme outer polycrystalline silicon layer 14c satisfies $x \leq y/40$, the magnitude of the curveness deformations is independent of both the number of the alternately laminated polycrystalline silicon layers 14 and silicon oxide films 15 and the thickness of the silicon oxide films 15. As the DI substrate 10 is almost freed from the curveness deformations even after manufacturing processes including the diffusion process, whereby desired circuit elements can be formed in the monocrystalline silicon island regions 11a to 11n with high accuracy.

FIGS. 3 and 4 show that the smaller the ultimate thickness x of the extreme outer polycrystalline silicon layer 14c after polishing, the smaller the curveness deformation of the DI substrate will be.

Even when irregular growth of the polycrystalline silicon layers 14a to 14c as shown at a circle α of FIG. 5 causes a local difference in the ultimate thickness of the extreme outer polycrystalline silicon layer 14c or when a local difference in the thickness of the layer 14c takes place after polishing, there is no problem as far as the polished surface of the extreme layer is highly flat.

Accordingly, in consideration of the parallelism of top and bottom surfaces of the DI substrate, the roughness of the extreme outer polycrystalline silicon layer surface, the working accuracy and the strength of the substrate, it is not preferable to polish the extreme outer polycrystalline silicon layer to make zero its ultimate thickness but preferable to polish it to make large its ultimate thickness as possible within the allowable range that the DI substrate is freed from the curveness deformation during the diffusion process.

While, in the foregoing description, the oxygen diffusion preventive film has been explained by way of a silicon oxide film, silicon nitride ($Si_3N_4$) films aluminum oxide ($Al_2O_3$) films or composite films of these components may be used.

The preparation processes of FIGS. 1 and 2 are called a single-poly method wherein polycrystalline silicon layers are formed on one surface of the monocrystalline silicon wafer. This invention, however, may be applicable to a double-poly method wherein polycrystalline silicon layers are formed on both surfaces of the monocrystalline silicon wafer and other various preparation methods of the DI substrate.

Referring now to FIG. 6, one example of the invention will be described wherein a DI substrate is prepared in accordance with a double-poly method.

Figure 6A:
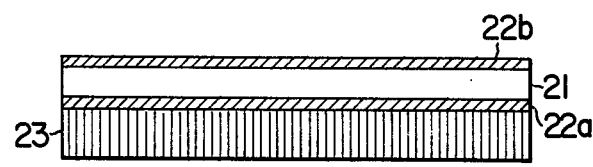
FIGS. 6a to 6d and FIGS. 7a to 7d are longitudinal section views showing preparation steps of DI substrates according to this invention based on double-poly method and etch epitaxial refill method, respectively.
Figure 6B:
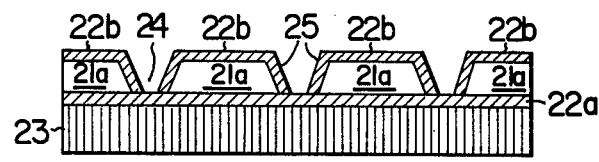

As shown in FIG. 6a, silicon oxide films 22a and 22b are formed on both principal surfaces of a monocrystalline silicon wafer 21 by thermally oxidizing the monocrystalline silicon wafer 21, and a polycrystalline silicon layer 23 is formed on the silicon oxide film 22a on one side by the vapor growth. Then, as shown in FIG. 6b, the silicon oxide film 22b on the opposite side is partially removed and the monocrystalline silicon wafer 21 is selectively etched to form a grid pattern of separation channels 24, thereby the silicon oxide film 22a on one side being exposed partially.

Since the monocrystalline silicon wafer 21 separated into a plurality of monocrystalline silicon island regions 21a by the grid pattern separation channel 24, individual monocrystalline silicon island regions 21a are temporarily supported by the polycrystalline silicon layer 23. In this point, the double-poly method differs from the previous single-poly method.

Next, after, forming a silicon oxide film 25 on the side peripheral surface of individual monocrystalline silicon islands 21a by thermal oxidation, the polycrystalline silicon layer 23 to which the monocrystalline silicon island regions 21a are secured is placed in a vapor growth furnace. Therein, a support region 28 including an alternate lamination of polycrystalline silicon layers 26a, 26b and 26c and silicon oxide films 27a and 27b is prepared.

Figure 6C:
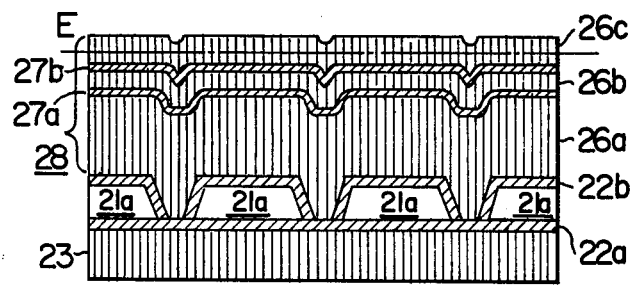

As shown in FIG. 6a, the polycrystalline silicon layer 23 is formed on the flat monocrystalline silicon wafer 21 so that the surface of the polycrystalline silicon layer 23 is considered to be flat. By using as datum plane this flat surface of the polycrystalline silicon layer 23, the extreme outer polycrystalline silicon layer 26c is polished to a level E as shown in FIG. 6c.

Figure 6D:
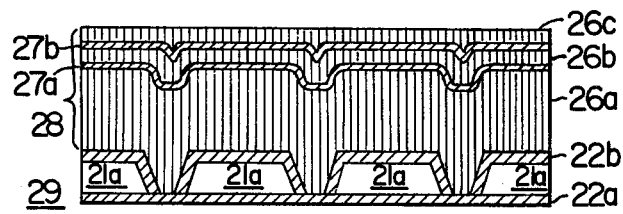

Thereafter, by using as datum plane the flat surface of the extreme outer polycrystalline silicon layer 26c thus obtained by polishing, the polycrystalline silicon layer 23 is polished to form a DI substrate 29 as shown in FIG. 6d.

The layer 26c may be removed by chemical etching. The polycrystalline silicon layer 23 is removed uniformly to ensure uniformity of the thickness of the monocrystalline silicon island regions 21a and that of the DI substrate 29.

Further, the exposed flat surface of the extreme outer polycrystalline silicon layer 26c of the support region 28 ensures easy handling of the substrate by means of the vacuum chuck so that various circuit elements may be formed accurately in the monocrystalline silicon island regions 21a without yielding the curveness deformation of the DI substrate 29.

Turning to FIG. 7, one example will be described wherein the invention is applied to an etch epitaxial refill method hereunder.

This preparation method is an improvement of the single poly method explained with reference to FIGS. 1 and 2, and uses as mother material a monocrystalline silicon wafer into which N-type impurities are diffused at a high concentration.

The steps employed in the example shown in FIG. 2b are similar to those of this example and a description thereof will be omitted in the following explanation. Additionally, FIG. 2b corresponds to FIG. 7a. A plurality of monocrystalline silicon island regions 31a into which impurities are diffused at a high concentration are supported by a support region 38 through a silicon oxide film 32.

The support region 38 is an alternate lamination of polycrystalline silicon layers 36a, 36b and 36c and silicon oxide films 37a and 37b, and the extreme outer polycrystalline silicon layer 36c is polished, leaving behind a certain thickness, to make a flat surface.

Figure 7A:
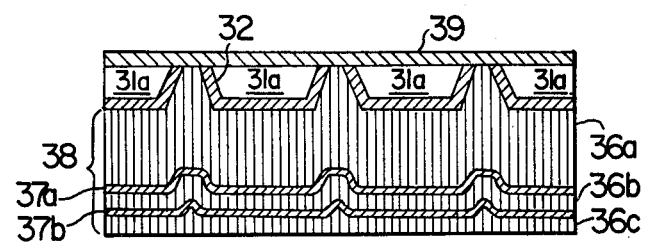
Figure 7B:
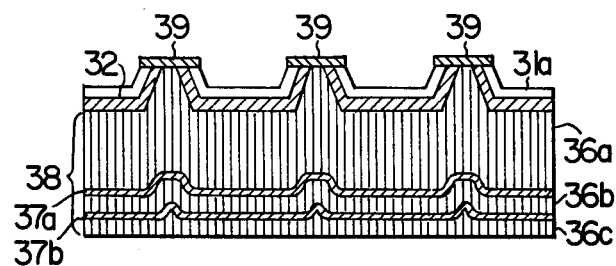
Figure 7C:
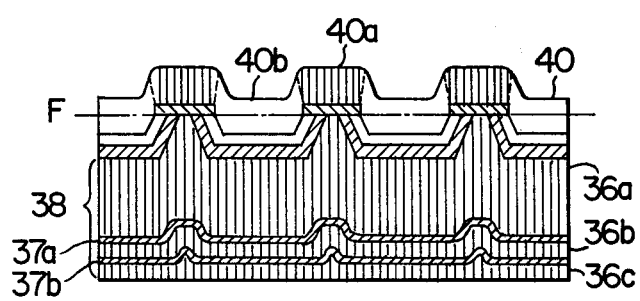

A silicon oxide film 39 acting as mask is formed on the top principal surface to which the monocrystalline silicon island regions 31a are exposed, and the film 39 on the island regions 31a is selectively removed by etching. As shown in FIG. 7b, individual monocrystalline silicon island regions 31a are also removed, leaving behind a predetermined thickness portion.

Thereafter, a silicon layer 40 added with impurities at low concentration is applied by vapor growth. Some parts of the silicon vapor grown layer 40 in register with the silicon oxide film 39 become polycrystalline regions 40a whereas the remaining parts in register with the etched monocrystalline silicon island regions 31a become monocrystalline regions 40b.

Figure 7D:
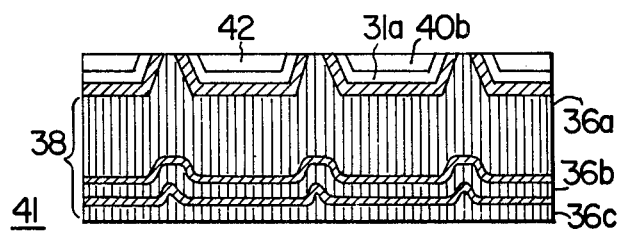

Next, by using as datum plane the bottom flat surface of the extreme outer polycrystalline silicon layer 36c, the silicon vapor grown layer 40 is removed by polishing at a level F designated at a chained line to obtain a DI substrate 41 as shown in FIG. 7d.

Therefore, the island regions 42 comprise the monocrystalline silicon high concentration regions 31a and the monocrystalline silicon low concentration regions 40b.

In this method, too, the DI substrate 41 is freed from the curveness deformation during the oxidization and diffusion processes so that various circuit elements can be formed in the monocrystalline silicon low concentration regions 40b with high accuracy.

We claim:
1. A dielectric insulator separated substrate for semiconductor integrated circuits comprising a plurality of monocrystalline semiconductor island regions in which circuit elements are to be formed; and a support region in contact with said island regions through a dielectric film, said support region comprising alternately laminated multiple layer structure of polycrystalline semiconductor layers and at least one oxygen diffusion preventive film, said island regions being electrically isolated from each other by said dielectric film, wherein the extreme outer layer of said support region is composed of a polycrystalline semiconductor layer and has a highly polished flat surface, the thickness of said extreme outer polycrystalline semiconductor layer being represented by the formula,

$$x \leq y/40,$$

where x represents the ultimate thickness of said extreme outer polycrystalline semiconductor layer, and y represents the entire thickness of said dielectric insulator separated substrate of 200–500 microns.

2. The dielectric insulator separated substrate for semiconductor integrated circuits as recited in claim 1, wherein said monocrystalline semiconductor island regions are of monocrystalline silicon, said dielectric film is of silicon oxide, said polycrystalline semiconductor layers are of polycrystalline silicon, and said oxygen diffusion preventive film is of silicon oxide.

3. The dielectric insulator separated substrate for semiconductor integrated circuits as recited in claim 1, wherein said oxygen diffusion preventive film is of one of a silicon oxide film, a silicon nitride film and an aluminum oxide film or a combination thereof.

* * * * *